United States Patent [19]

Teramoto et al.

[11] Patent Number: 5,795,816
[45] Date of Patent: Aug. 18, 1998

[54] METHOD OF FABRICATING SEMICONDUCTOR DEVICE

[75] Inventors: Satoshi Teramoto; Akira Takenouchi; Hisashi Ohtani, all of Kanagawa, Japan

[73] Assignee: Semiconductor Energy Laboratory Co., Ltd., Japan

[21] Appl. No.: 452,285

[22] Filed: May 26, 1995

[30] Foreign Application Priority Data

Jun. 14, 1994 [JP] Japan .................................. 6-156648

[51] Int. Cl.$^6$ .................................................. H01L 21/20
[52] U.S. Cl. .......................................... 438/479; 438/486
[58] Field of Search ................... 148/DIG. 90, DIG. 93, 148/DIG. 91, DIG. 92; 437/907, 174; 438/479, 486

[56] References Cited

U.S. PATENT DOCUMENTS

| | | | |
|---|---|---|---|
| 4,609,407 | 9/1986 | Masao | ........................................ 437/56 |
| 5,147,826 | 9/1992 | Liu et al. . | |
| 5,275,851 | 1/1994 | Fonash et al. . | |
| 5,426,064 | 6/1995 | Zhang | ........................................ 437/40 |

OTHER PUBLICATIONS

"Crystallized Si Films By Low–Temperature Rapid Thermal Annealing of Amorphous Silicon", R. Kakkad, J. Smith, W.S. Lau, S.J. Fonash, J. Appl. Phys. 65 (5), Mar. 1, 1989, 1989 American Institute of Physics, pp. 2069–2072.

"Polycrystalline Silicon Thin Film Transistors on Corning 7059 Glass Substrates Using Short Time, Low Temperature Processing", G. Liu, S.J. Fonash, Appl. Phys. Lett. 62 (20), May 17, 1993, 1993 American Institute of Physics, pp. 2554–2556.

"Selective Area Crystallization of Amorphous Silicon Films by Low–Temperature Rapid Thermal Annealing", Gang Liu and S.J. Fonash, Appl. Phys. Lett. 55 (7), Aug. 14, 1989, 1989 American Institute of Physics, pp. 660–662.

"Low Temperature Selective Crystallization of Amorphous Silicon", R. Kakkad, G. Liu, S.J. Fonash, Journal of Non-–Crystalline Solids, vol. 115, (1989), pp. 66–68.

C. Hayzelden et al., "*In Situ* Transmission Electron Microscopy Studies of Silicide–Mediated Crystallization of Amorphous Silicon" (3 pages).

A. V. Dvurechenskii et al., "Transport Phenomena in Amorphous Silicon Doped by Ion Implantation of 3d Metals", *Akademikian Lavrentev Prospekt* 13, 630090 Novosibirsk 90, USSR, pp. 635–640.

T. Hempel et al., "Needle–Like Crystallization of Ni Doped Amorphous Silicon Thin Films", *Solid State Communications*, vol. 85, No. 11, pp. 921–924, 1993.

*Primary Examiner*—John Niebling
*Assistant Examiner*—Brendan Mee
*Attorney, Agent, or Firm*—Sixbey, Friedman, Leedom & Ferguson; Gerald J. Ferguson, Jr.; Jeffrey L. Costellia

[57] ABSTRACT

Method of fabricating a thin-film transistor. This transistor has a semiconductor such as a silicon semiconductor. This semiconductor is irradiated with pulsed laser light having a pulse width which is set greater than 1 µs to maintain molten state of the silicon surface for a long time. As a result, a silicon film having high crystallinity can be obtained. This scheme can be used for crystallization of an amorphous silicon film and for activation effected after implantation of impurity ions.

14 Claims, 4 Drawing Sheets

LASER LIGHT IRRADIATION

IMPURITY ION IMPLANTATION

LASER LIGHT IRRADIATION

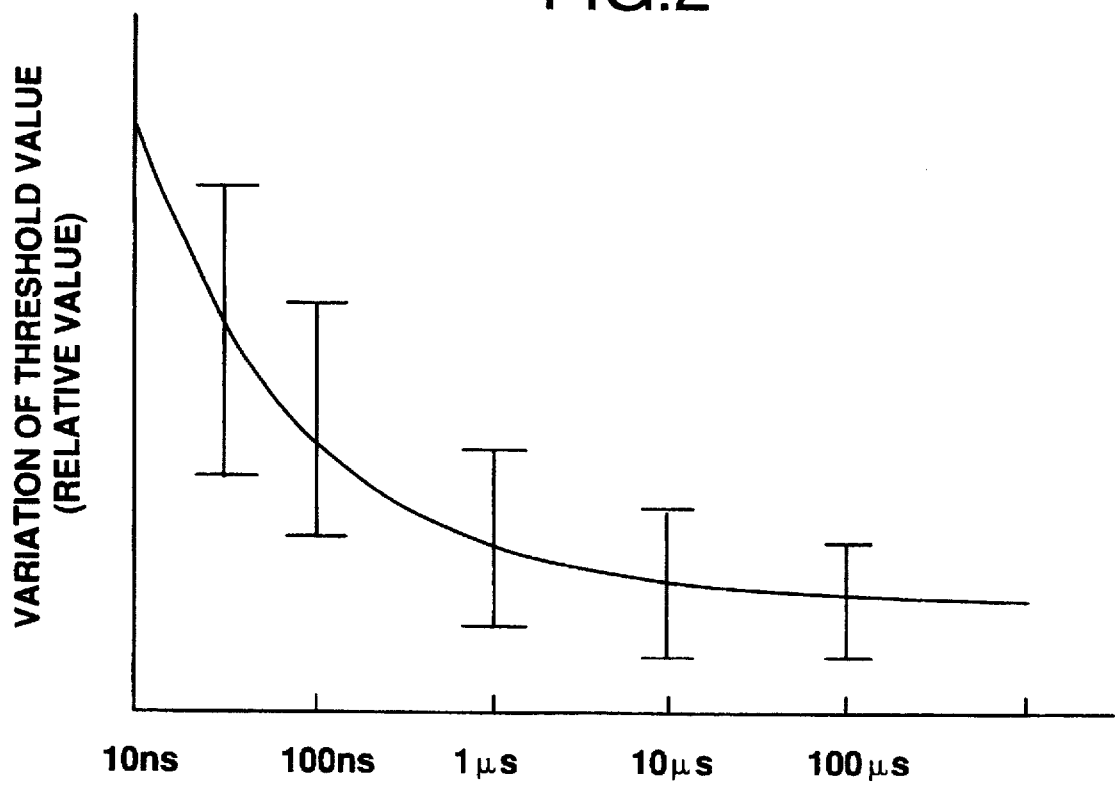

LASER LIGHT IRRADIATION AND ADDITIONAL LIGHT IRRADIATION

METHOD OF FABRICATING SEMICONDUCTOR DEVICE

BACKGROUND OF THE INVENTION

1. Field of the Invention

The present invention relates to a method of fabricating thin-film transistors or other semiconductor devices through the use of laser light.

2. Description of the Related Art

In recent years, techniques for fabricating active matrix liquid crystal displays, using thin-film transistors formed on glass substrates, have come to known. Where glass substrates are used, it is generally impossible to heat-treat them at high temperatures because of poor heatproofness (generally on the order of 600° C.) of the glass substrates. Therefore, thin films having required crystallinity cannot be obtained. Furthermore, a high temperature needed to activate source/drain regions cannot be employed.

One means for solving the foregoing problems is to crystallize amorphous silicon films or to recrystallize or activate source/drain regions by the use of laser radiation. However, completed thin-film transistors have characteristics which vary widely from product to product. In this way, thin-film transistors fabricated, using the above-described laser irradiation and various annealing steps, have nonuniform characteristics.

It is considered that this problem arises from the pulse spacings of laser radiation emitted by pulsed excimer lasers. Normally, generated pulses have widths of about 50 ns. In this case, the surface of a silicon film is melted within a period shorter than tens of nanoseconds. During this short period, the silicon in liquid phase crystallizes. At this time, crystallization occurs in a very short time. Therefore, the obtained crystallinity or the quality of films obtained after laser irradiation is affected greatly by slight variations in film quality or by variations in surface flatness.

SUMMARY OF THE INVENTION

It is an object of the present invention to provide a method of fabricating thin-film transistors by the use of laser irradiation in such a way that molten state of the surfaces is maintained as long as possible when a silicon film is irradiated with pulsed laser light, thus enhancing the effect of the laser irradiation.

In one feature of the invention, an amorphous silicon film or amorphized silicon film is irradiated with pulsed laser light having a pulse width of 1 μs to 100 ms. This process is mainly intended to crystallize the amorphous or amorphized silicon film by the irradiation of the pulsed laser light described above.

In the above-described structure, if a metal element for promoting the crystallization is contained in the silicon film, then the effect can be enhanced further. If this metal element for promoting the crystallization is one or more selected from the group consisting of Fe, Co, Ni, Ru, Rh, Pd, Os, Ir, Pt, Cu, Ag, and Au, then the effect can be enhanced still further.

In the above-described structure, if an impurity for imparting one conductivity type is added to the silicon film, the effect can be enhanced yet further.

Atoms which enter a silicon film and act as metal elements for promoting the crystallization include Co, Ni, Ru, Rh, Pd, Os, Ir, Pt, Cu, Ag, and An. During heat-treating steps, these elements diffuse into the silicon film. Simultaneously with the diffusion, crystallization of the silicon progresses. That is, these intrusion type metals act like catalysts at locations into which they are diffused, and promote the crystallization of the amorphous silicon film.

Since the intrusion type elements rapidly diffuse themselves into the silicon film, the amount of addition is of importance. In particular, if the amount of addition is small, then crystallization is less promoted. Hence, good crystallinity cannot be obtained. Conversely, if the amount of addition is excessive, then the semiconductor characteristics of the silicon are impaired.

Accordingly, the above-described metal elements introduced in the amorphous silicon film have optimum amounts. For example, where Ni is used as a metal element for accelerating the crystallization, it is known that if the concentration of the nickel in a crystallized silicon film is more than $1 \times 10^{15}$ cm$^{-3}$, promotion of the crystallization can be achieved, and that if the concentration in the crystallized silicon film is less than $1 \times 10^{19}$ cm$^{-3}$, the semiconductor characteristics are not deteriorated. The concentration is defined as the minimum value obtained by SIMS (secondary ion mass spectrometry). The metal elements mentioned above excluding Ni can yield similar advantages in concentration ranges similar to the concentration range of Ni.

Where Al or Sn is used other than the metal elements enumerated above, crystallization of the amorphous silicon film can be promoted. However, Al or Sn is alloyed with silicon and thus does not diffuse into the silicon film. The resulting alloy serves as crystal seeds, and crystal growth starts from these crystal embryos. Where Al or Sn is used in this way, crystal growth occurs only at the portions (or layer of alloy of this element with silicon) into which Al or Sn is introduced. For this reason, the obtained crystallinity is generally inferior to the crystallinity obtained by using an intrusion type element such as Ni as mentioned above. For instance, it is generally difficult to obtain a uniformly crystallized silicon film.

The molten state of the amorphous silicon film surface can be retained for a longer time by irradiating the amorphous silicon film with laser light having a pulse width of more than 1 μs. Also, the period during which the crystal grows can be prolonged. As a result, the crystal growth process is less affected by the film quality or by the surface flatness. Consequently, a constant effect can be always obtained without being affected by subtle variations in film quality or by subtle variations in surface flatness. That is, crystalline silicon films having uniform crystallinity and uniform electrical characteristics can be derived at all times.

Where a metal element for promoting the crystallinity of a silicon film is introduced in the silicon film which will be irradiated with laser light, the effect of the laser irradiation on the crystallization is very great. Also in this case, annealing effects can be obtained by laser irradiation without being materially affected by subtle variations in film surface or surface flatness.

Other objects and features of the invention will appear in the course of the description thereof, which follows.

BRIEF DESCRIPTION OF THE DRAWINGS

FIG. 2 is a graph showing the relation of the variation of the threshold value of a completed thin-film transistor fabricated by the sequence illustrated in FIGS. 1(A)–1(D) to the pulse width of irradiated laser light;

DETAILED DESCRIPTION OF THE PREFERRED EMBODIMENTS

Figure 1A:
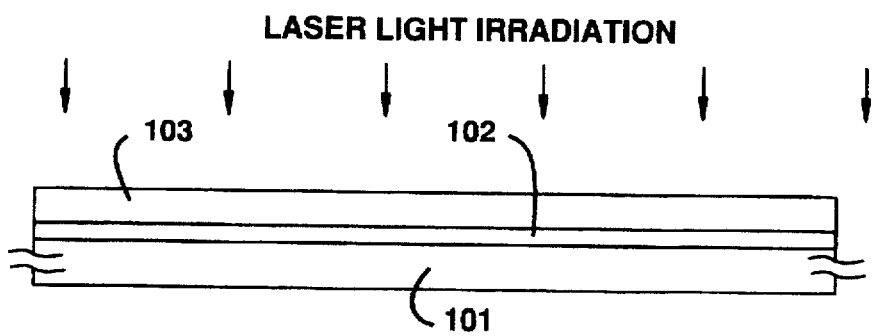
FIGS. 1(A)–1(D) are cross-sectional views of a thin-film transistor, illustrating the process sequence for fabricating the transistor according to the invention.

The preferred embodiments of the invention are hereinafter described with reference to the accompanying drawings. The following embodiments are thin-film transistors arranged at pixels on an active matrix liquid crystal display. These thin-film transistors can also be used as peripheral circuit regions of liquid crystal displays, image sensors, and various thin-film integrated circuits.

EXAMPLE 1

First, silicon oxide is deposited as a buffer film consisting of a silicon oxide film 102 having a thickness of 2000 Å on a glass substrate 101, e.g. Corning 7059, by sputtering. Then, an amorphous silicon film 103 is formed to a thickness of 1000 Å by plasma CVD or low-pressure thermal CVD method. Subsequently, nickel that is a metal for promoting crystallization is introduced into the amorphous silicon film. In this example, a solution of nickel acetate is applied to the surface of the amorphous silicon film by spin coating, thus introducing nickel element into the amorphous silicon film.

Thereafter, the laminate is heat-treated at 550° C. for 4 hours to crystallize the amorphous silicon film 103. This heat-treatment can be made above 450° C. but thermal damage to the glass substrate presents problems at temperatures higher than 550° C. Therefore, it is desired to perform the heat-treatment below 550° C.

After the completion of the heat-treatment, the crystalline silicon film is irradiated with laser light to further enhance the crystallinity of the silicon film. Crystallinity is imparted to the silicon film by the action of the metal element for promoting crystallization and by means of the heating. This crystalline silicon film contains a large amount of amorphous component. The laser irradiation crystallizes the amorphous component, and the crystallinity can be enhanced further. In this example, the pulse width is 100 µs. The energy density of the irradiated light is 250 mJ/cm².

Then, the obtained crystalline silicon film is photolithographically patterned to obtain an active layer of a thin-film transistor. Subsequently, a silicon oxide film 104 acting as a gate-insulating film is formed to a thickness of 100 Å by plasma CVD. A film consisting mainly of aluminum is formed to a thickness of 5000 Å and photolithographically patterned to form a gate electrode 105. An anodic oxidation process is carried out in an electrolytic solution, using the gate electrode as an anode. Thus, an oxide layer 106 is formed.

Figure 1B:
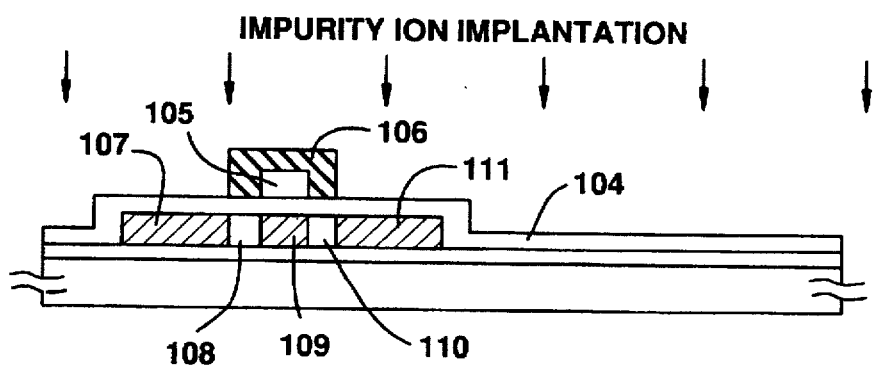
Figure 1C:
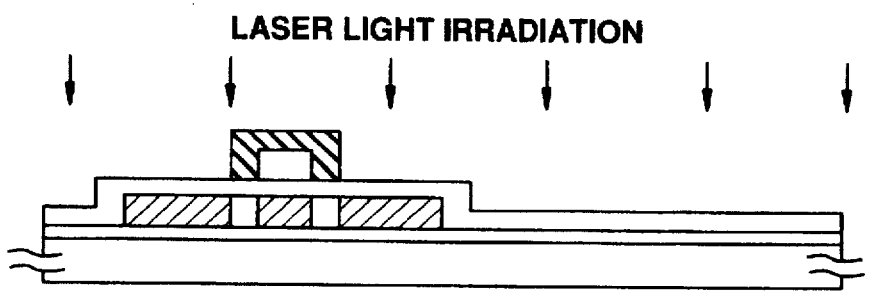
Figure 1D:
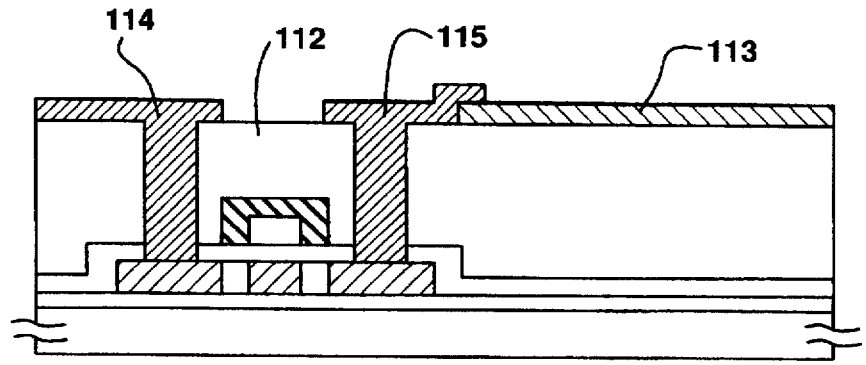

Impurity ions are implanted to impart one conductivity type. In this way, a source region 107 and a drain region 111 are formed. At this time, an offset gate region 108 and a channel formation region 109 are simultaneously formed. In this example, phosphorus (P) ions are implanted to fabricate an N-channel thin-film transistor (FIG. 1(B)).

The laminate is irradiated with laser light to activate the source/drain regions. In this step, the source/drain regions amorphized by the previous impurity ion implantation step are recrystallized. Also, the implanted impurity is activated. For this laser irradiation, XeCl laser light having a wavelength of 308 nm is used. The pulse width is 100 µs. The energy density of the irradiated light is 250 mJ/cm².

An interlayer insulating film 112, a silicon oxide film 113 forming pixel electrodes, a source electrode 114, and a drain electrode 115 are formed, thus completing the thin-film transistor.

In the present fabrication sequence, the pulse width was varied from 50 ns to 100 µs. The variation (relative value) of the threshold value ($V_{th}$) of each completed thin-film transistor was measured. The relation of the pulse width to the variation is shown in the graph of FIG. 2.

As can be seen from FIG. 2, where the pulse width is set larger than 1 µs, variations (relative value) of the threshold values ($V_{th}$) of completed thin-film transistors can be reduced greatly.

The upper limit of the pulse width should be set less than 100 ms, for the following reasons. It is difficult to generate pulsed light having pulse widths greater than this value. Where this upper limit is exceeded, the thermal damage to the glass substrate presents problems.

EXAMPLE 2

Figure 3:
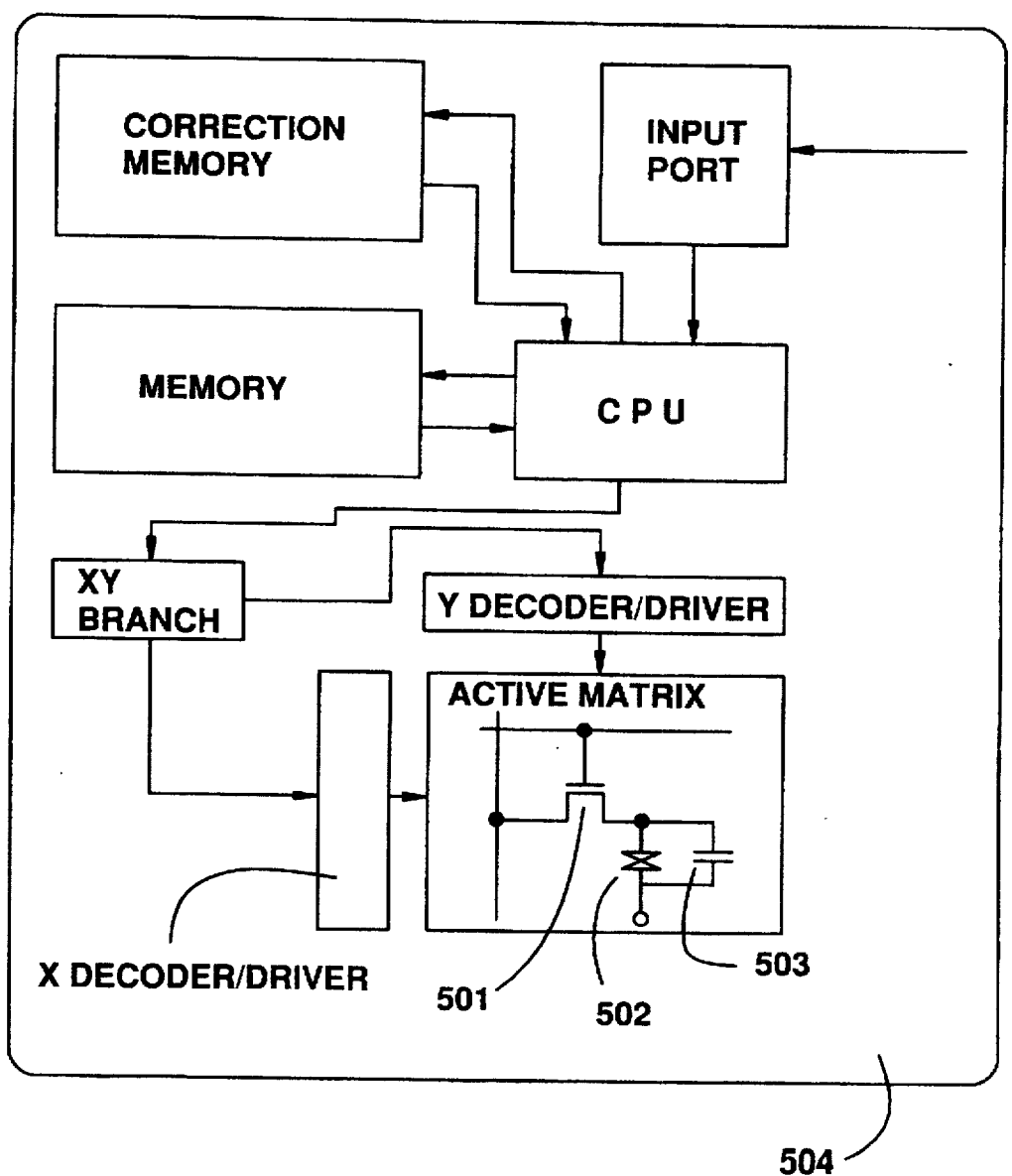
FIG. 3 is a schematic block diagram of an electrooptical device using thin-film transistors fabricated according to the invention.

FIG. 3 is a block diagram of an electrooptical device comprising an active matrix circuit, its driver circuit, and other circuits all of which are formed on a substrate 504. The active matrix circuit is made up of thin-film transistors (TFTs). These TFTs include 126 and 127 which are used for an X/Y decoder/driver, a CPU, and logic circuitry for various memories. Other TFTs 128 are used as a switching TFT 501 for pixels of the active matrix circuit, as sampling TFTs of the driver circuit, and as devices forming the active matrix circuit for various memories. Capacitors 129 are used as an auxiliary capacitor 503 for a pixel cell 502 of the active matrix circuit and as storage devices for the various memories. Where required various circuits are formed on the glass substrate as shown in FIG. 2, the use of the novel fabrication sequence is useful because the laser irradiation results in relatively uniform characteristics.

EXAMPLE 3

Figure 4A:
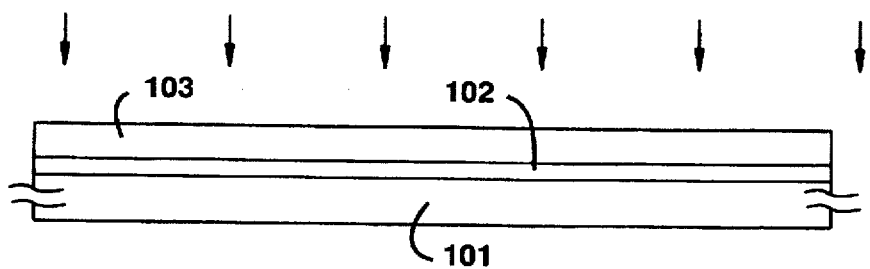
FIGS. 4(A)–4(D) are cross-sectional views of a thin-film transistor, illustrating the process sequence for fabricating the transistor according to the invention.
Figure 4B:
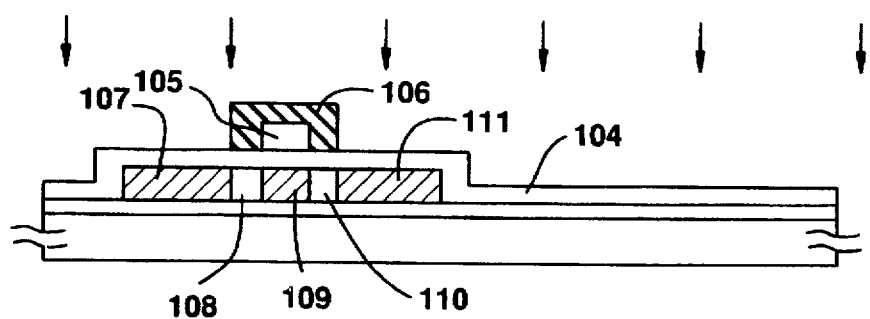
Figure 4C:
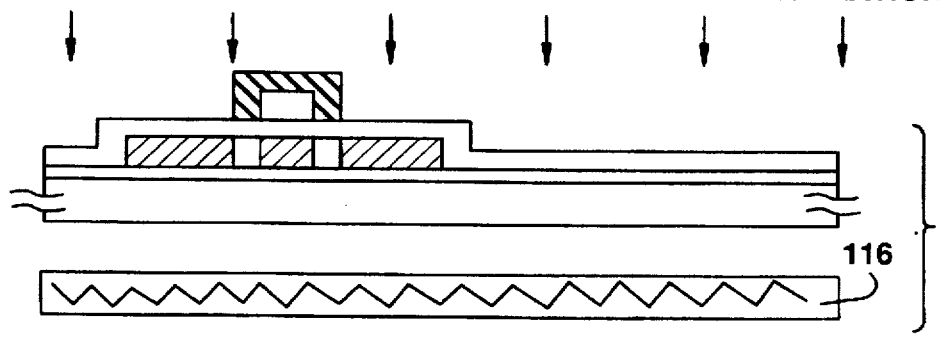
Figure 4D:
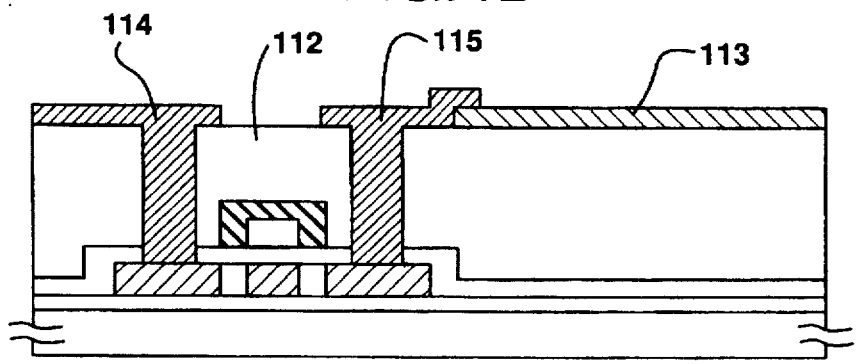

Referring to FIGS. 4(A) to 4(D), a process for fabricating a semiconductor device in accordance with a further embodiment of the present invention is described below. This process is same as the process described in EXAMPLE 1 except that an additional light having a wavelength of 0.1 to 2 µm is irradiated to the semiconductor island active layer provided on the glass substrate 101 at the same time as a laser light is irradiated to the semiconductor island active layer, as illustrated in FIG. 4(C). By the irradiation of the additional light having a wavelength of 0.1 to 2 µm, temperature of the semiconductor island active layer is typically elevated to 100° to 300° C. The substrate and the semiconductor island active layer may be heated by a heater 116 provided under the substrate at a temperature of room temperature to 500° C. at the same time as the irradiation of the laser light and the additional light, as illustrated in FIG. 4(C).

The annealing effect on a semiconductor irradiated with pulsed laser can be made uniform by setting the oscillation frequency of the pulsed laser light larger than 1 µs. As a result, thin-film transistors having characteristics which vary only a little from product to product can be manufactured. Obviously, the present invention can be used for fabrication of various semiconductors.

What is claimed is:

1. A method of fabricating a semiconductor device, comprising the steps of:

forming an amorphous or amorphized semiconductor film on an insulating surface; and irradiating said semiconductor film, wherein said semiconductor film is irradiated with pulsed light having a pulse width of 1 µs to 100 ms and another light having a wavelength of 0.1 to 2 µm.

2. A method according to claim 1 wherein said light is a laser.

3. A method of fabricating a semiconductor device, comprising the steps of:

forming semiconductor film on an insulating surface;

heating said semiconductor film to crystallize;

introducing an impurity into said semiconductor film; and irradiating said semiconductor film with pulsed laser light having a pulse width of 1 µs to 100 ms and another light having a wavelength of 0.1 to 2 µm in order to further promote crystallization of said semiconductor film.

4. A method according to claim 3 wherein said impurity is phosphorus.

5. A method of fabricating a semiconductor device according to claim 1 or 3, or wherein a metal element for promoting crystallization of said semiconductor film is contained in said semiconductor film.

6. A method of fabricating a semiconductor device according to claim 1 or 3, wherein at least one metal element for promoting crystallization of said semiconductor film is contained in said semiconductor film, and wherein said at least one metal element is one or more selected from the group consisting of Fe, Co, Ni, Ru, Rh, Pd, Os, Ir, Pt, Cu, Ag, and An.

7. A method of fabricating a semiconductor device according to claim 1 or 3, wherein said semiconductor film is doped with an impurity for imparting one conductivity type.

8. A method of fabricating a semiconductor device according to claim 1 or 3, wherein a metal element for promoting crystallization of said semiconductor film is contained in said semiconductor film at a concentration of $1 \times 10^{15}$ to $1 \times 10^{19}$ cm$^{-3}$.

9. A method according to claim 1 or 3 or wherein said semiconductor comprises silicon.

10. A method for fabricating a semiconductor device, comprising the steps of:

irradiating a pulsed laser light having a pulse width of 1 µs to 100 ms to an amorphous silicon film or a silicon film made amorphous provided on a glass substrate; and irradiating a light having a wavelength of 0.1 to 2 µm to said amorphous silicon film or said silicon film made amorphous at the same time as said pulsed laser light irradiating step.

11. The method of claim 10 further comprising the step of heating said glass substrate by a heater provided under said glass substrate at the same time as said pulsed laser light irradiating step.

12. The method of claim 11 wherein said glass substrate is heated to a temperature of room temperature to 500° C. during said heating step.

13. The method of claim 10 wherein said pulsed laser light is irradiated from above said amorphous silicon film or said silicon film made amorphous.

14. The method of claim 10 wherein said light having a wavelength of 0.1 to 2 µm is irradiated from above said amorphous silicon film or said silicon film made amorphous.

* * * * *